United States Patent [19]
Bradley

[11] Patent Number: 5,708,377
[45] Date of Patent: Jan. 13, 1998

[54] LOW POWER DUAL SAMPLER UTILIZING STEP RECOVERY DIODES (SRDS)

[75] Inventor: Donald A. Bradley, Morgan Hill, Calif.

[73] Assignee: Wiltron Company, Morgan Hill, Calif.

[21] Appl. No.: 606,380

[22] Filed: Feb. 23, 1996

[51] Int. Cl.$^6$ .................................................. G11C 27/02
[52] U.S. Cl. ........................................... 327/91; 327/304
[58] Field of Search ................................ 327/91, 94, 96, 327/300, 304, 320, 551, 552, 514, 326, 325, 502, 504; 333/101, 103, 131

[56] References Cited

U.S. PATENT DOCUMENTS

| | | | |
|---|---|---|---|
| 4,616,191 | 10/1986 | Galani et al. | 331/4 |
| 4,810,904 | 3/1989 | Crawford | 327/93 |
| 4,956,568 | 9/1990 | Su et al. | 327/91 |
| 5,113,094 | 5/1992 | Grace et al. | 327/119 |
| 5,361,070 | 11/1994 | McEwan | 342/21 |
| 5,378,939 | 1/1995 | Marsland et al. | 327/94 |
| 5,430,595 | 7/1995 | Wagner et al. | 327/304 |

*Primary Examiner*—Timothy P. Callahan
*Assistant Examiner*—My-Trang Nu Ton
*Attorney, Agent, or Firm*—Fliesler, Dubb, Meyer & Lovejoy

[57] ABSTRACT

A low power dual sampler including two sampler switches with a step recovery diode (SRD) in each sampler switch. A local oscillator (LO) signal is provided through a power amplifier and transformer to baluns in the sampler switches without utilizing a power splitter, providing limited power loss to each balun. Each balun is configured to provide the LO signal to terminals of the SRD in a sampler switch without providing a termination to SRD impulses. Each sampler switch further includes series diodes connected across the terminals of each SRD switch with a junction of the series diodes connected to receive an RF signal, and the terminals of each SRD connected for providing an IF signal. To limit phase shift between SRD impulses, a temperature compensation circuit provides a DC offset voltage to each SRD. In one embodiment, each temperature compensation circuit includes an operational amplifier having a noninverting terminal coupled to a terminal of an SRD, an inverting terminal connected by a first resistor to ground, and an output connected by a second resistor to the inverting terminal and by a third resistor to the non-inverting terminal. To provide isolation between the sampler switches, a capacitor providing a high impedance to the LO signal and a low impedance to RF signals is connected at the interconnection of the sampler switches.

11 Claims, 4 Drawing Sheets

LOW POWER DUAL SAMPLER UTILIZING STEP RECOVERY DIODES (SRDS)

BACKGROUND OF THE INVENTION

1. Field of the Invention

The present invention relates to circuitry for dual samplers which utilize a step recovery diode. More particularly, the present invention relates to configuration of circuitry for the dual samplers to reduce power consumption.

2. Description of the Related Art

Dual samplers are conventionally utilized when demodulation of two signals is required at the same time, as for instance when both incident and reflected signals utilized for making measurements in a vector error corrected reflectometer (VECR) are demodulated together.

FIG. 1 shows circuitry for a conventional dual sampler which utilizes one step recovery diode (SRD) 102 and two sampler switches 106 and 108.

The response of the SRD 102 to an input local oscillator (LO) signal is illustrated in FIG. 2. As can be seen, in contrast to a conventional diode, an SRD stores charge when forward biased and releases the stored charge when becoming reverse biased to create an voltage impulse, such as 200.

In the circuit of FIG. 1, a single local oscillator (LO) signal provided to the SRD 102 is utilized to drive both samplers through a passive power splitter 104 to sampler switches 106 and 108 to create little phase difference between IF outputs of the sampler switches. A phase difference between the IF outputs of the samplers can cause measurement errors in a VECR.

Little phase difference between the outputs of power splitter 104 becomes more critical with a harmonic sampler when RF frequency increases because the harmonic number (H) of the samplers increases. With a harmonic number of two, the voltage impulse provided by the SRD occurs at (H) X 360 degrees, or every 720 degrees of an RF signal. As RF frequency increases, the harmonic number also increases, potentially reaching H=80, resulting in an impulse occurring every 28,800 degrees. With a low harmonic number, the phase difference of the SRD signal as provided to the sampler switches 106 and 108 is not critical, but with a larger harmonic number, such as 80, the phase difference between the SRD signals as provided to the sampler switches becomes critical to prevent errors.

By utilizing the circuit of FIG. 1 to limit phase errors, however, the power required to drive the SRD will be significant. Typical LO power required to drive an SRD as configured in FIG. 1 is in the range of 100–200 milliwatts. The DC power then required to drive the power amplifier 100 which provides the LO signal to the SRD 102 with the required output of 100–200 milliwatts is in the range of 4–5 watts.

With battery power devices, such as the Site Master 300, a hand held VECR made by Wiltron Company of Morgan Hill, Calif., DC drive power in the 4–5 watt range for dual samplers will quickly drain the batteries. It is therefore desirable to have a low power dual sampler configured to provide limited phase shift between samplers over a broad frequency range.

Further with the circuit of FIG. 1, the sampler switches 106 and 108 each include a balun 110 and 112 connected to one of the 50 Ω resistor outputs of the power splitter 104. With only the 50 Ω resistors of the power splitter 104 separating the baluns 110 and 112, the baluns must be constructed to provide additional isolation between the RF inputs, or only 12 dB of isolation will exist between the sampler switches 106 and 108 as provided by splitter 104.

To provide significant isolation, baluns 110 and 112 are constructed using complex topologies, such as the topology shown in FIG. 3. In FIG. 3, the baluns are constructed using a stripline 300 to slotline 302, 304 transition. The stripline 300 serves to provide isolation from the slotline portions 302 and 304 in which the remaining discrete components for respective sampler switches 106 and 108 are provided. The stripline is then terminated with a matching impedance which consumes power from signals provided to the balun. Such a complex topology for baluns increases manufacturing costs and is undesirable.

SUMMARY OF THE INVENTION

The present invention includes circuitry for a dual sampler which operates with significantly less drive power than the dual sampler of FIG. 1.

The dual sampler of the present invention further utilizes two SRDs without incurring significant phase differences between the samplers.

The dual sampler of the present invention is further configured to provide significant isolation between sampler switches without utilizing complex circuit topology.

The present invention is a dual sampler including two sampler switches with a step recovery diode (SRD) in each sampler switch. A LO signal is provided through a power amplifier and transformer to a respective balun in each sampler switch. Each balun provides the LO signal to terminals the SRD in each sampler switch as separated by an inductor and can be constructed from an off the shelf part, rather than a complex structure, such as shown in FIG. 3. Each sampler switch further includes series diodes connected across the terminals of each SRD with a junction of the series diodes connected to receive an RF signal, and with the terminals of the series connected diodes providing an IF signal.

By utilizing a power amplifier and transformer to provide power to each sampler switch directly, rather than utilizing a power splitter, power required to provide an IF output from each sampler switch is significantly reduced from the circuit of FIG. 1. Further, with inductors separating the baluns and SRDs which follow the baluns, and the baluns being off the shelf parts, no power consuming termination is provided to the SRD impulses, unlike with pulses provided to a balun formed with a stripline to slotline transition as shown in FIG. 3.

To limit the phase shift between the voltage impulses generated by the SRDs, a temperature compensation circuit provides a DC offset voltage to each SRD. In one embodiment, each temperature compensation circuit includes an operational amplifier having a noninverting terminal coupled to a terminal of an SRD, an inverting terminal connected by a first resistor to ground, and an output connected by a second resistor to the inverting terminal and by a third resistor to the non-inverting terminal.

To provide isolation between the sampler switches, a capacitor providing a high impedance to the LO signal and a low impedance to RF signals is connected at the interconnection of the sampler switches.

BRIEF DESCRIPTION OF THE DRAWINGS

Further details of the present invention are explained with the help of the attached drawings in which.

DETAILED DESCRIPTION

Figure 4:
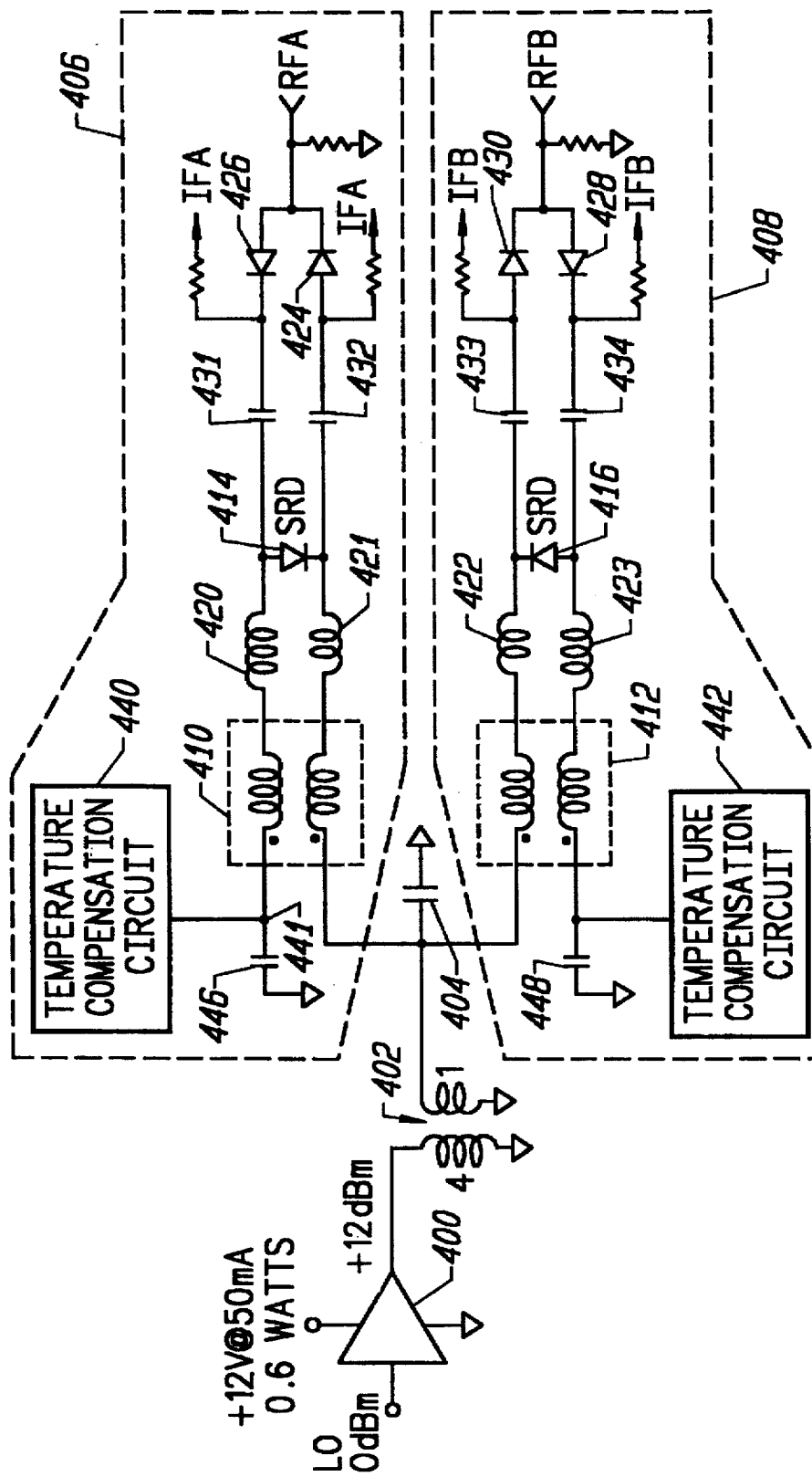
FIG. 4 shows circuitry for a dual sampler of the present invention.

FIG. 4 shows circuitry for a dual sampler of the present invention. Similar to the dual sampler of FIG. 1, the circuit of FIG. 4 includes a power amplifier 400 for providing a LO signal to two sampler switches 406 and 408. Instead of providing the LO signal to a single SRD, however, the circuit of FIG. 4 provides the LO signal to an SRD 414 and 416 in each of sampler switches 406 and 408.

Further, instead of distributing power through a power splitter, the present invention provides power to baluns 406 and 408 in each sampler switch 406 and 408 through a transformer 402. Further, unlike with the circuit of FIG. 1, in the present invention baluns 410 and 412 can be off the shelf components, rather than a device such as the complex stripline to slotline transition shown in FIG. 3. A first path of each balun 410 and 412 couples the transformer 402 to a first terminal of a respective SRD 414 and 416. A second path of each balun 410 and 412 couples a second terminal of the respective SRDs 414 and 416 to ground. The 4:1 transformer 402 serves to provide an impedance transformation from the high impedance of the power amplifier 400 output (approximately 50 Ω) to the 3 Ω impedance of each balun.

Figure 3:
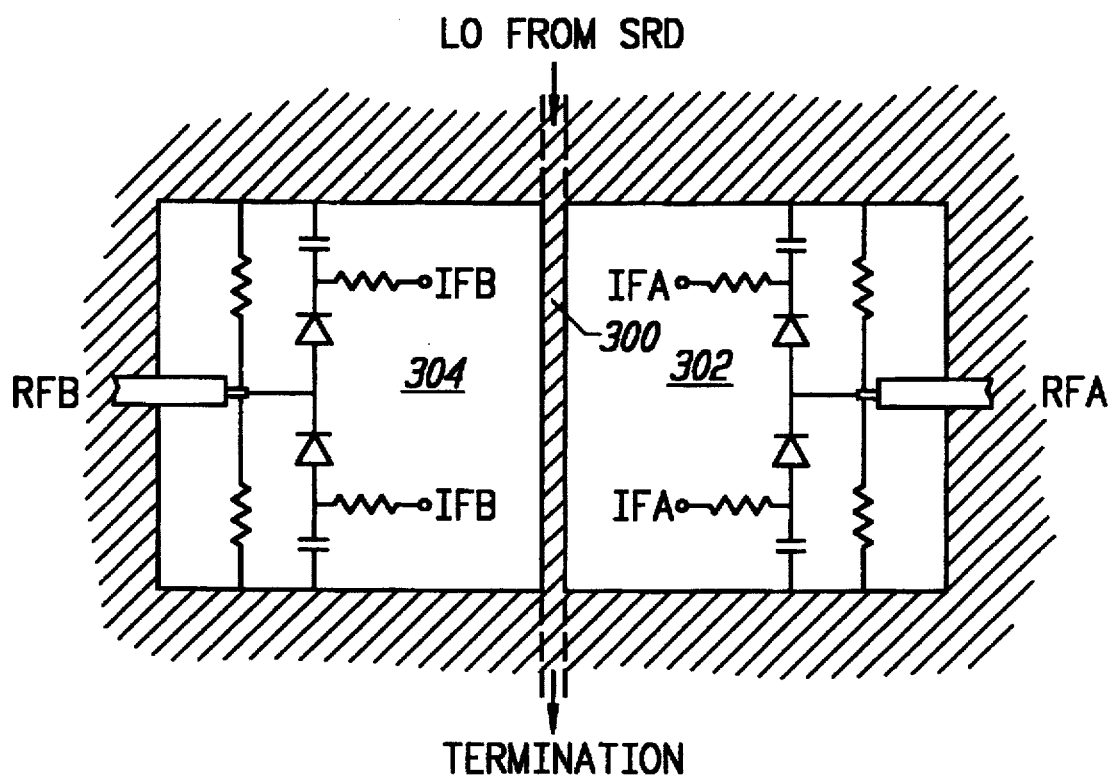
FIG. 3 illustrates the configuration of components utilized to manufacture the sampler switches shown in FIG. 1.

To provide isolation between the sampler switches, a capacitor 404 is connected at the junction of baluns 410 and 412 and transformer 402. The capacitor 404 is sized to provide a high impedance to the LO signal and a low impedance to an RF signal provided to either of the first or second sampler switches 406 and 408. Utilizing the capacitor 404, no complex topology for the baluns 410 and 412, such as the stripline to slotline transition shown in FIG. 3, is required to provide isolation. Baluns 410 and 412 can be provided as commercially available discrete components.

To prevent the voltage impulses provided from SRD 414 from affecting the circuitry of the power amplifier 400, inductors 420–423 are provided. Inductors 420 and 421 serve to couple the terminals of the SRD 414 to the first and second path of the balun 410. Inductors 422 and 423 serve to couple the terminals of the SRD 416 to the first and second path of the balun 412. Each of the isolation inductors 420–423 is sized to provide a low impedance to the LO signal, while providing a high impedance to voltage impulses from the SRDs 414 and 416.

Figure 1:
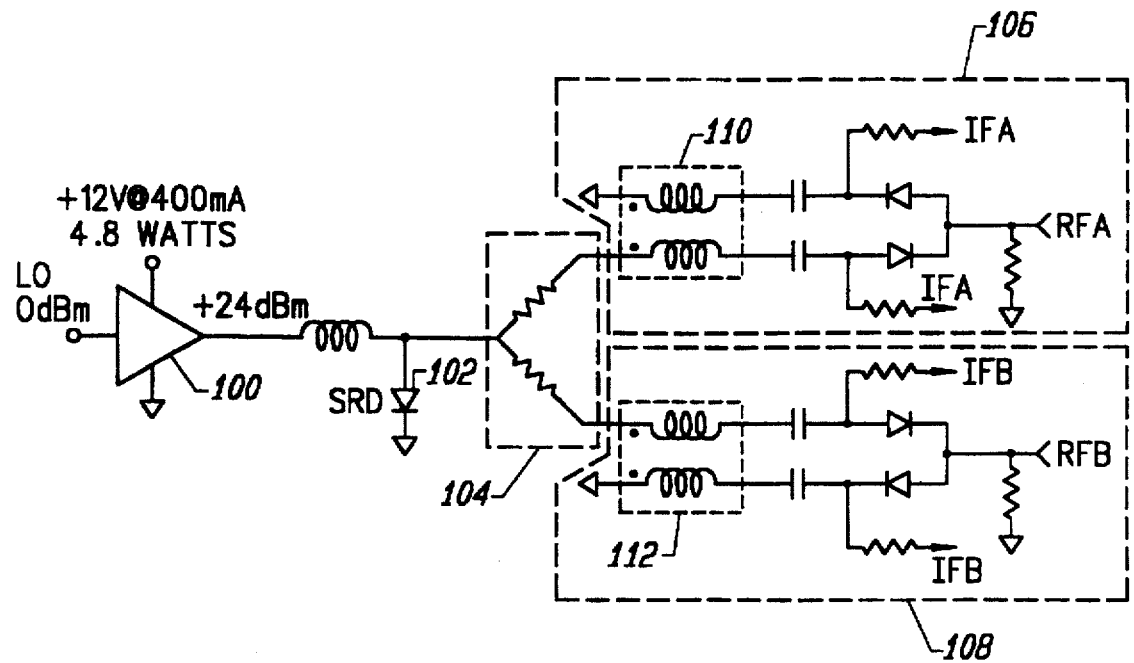
FIG. 1 shows circuitry for a conventional dual sampler.
Figure 2:
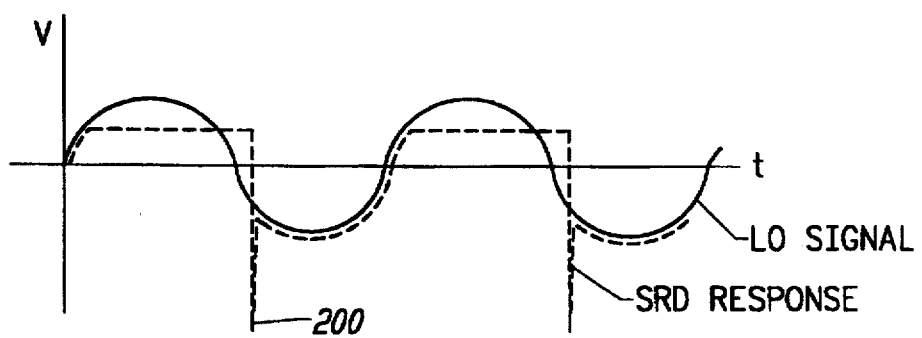
FIG. 2 illustrates the response of an SRD to a LO signal.

By eliminating a power splitter, and providing inductors 420–423, a significant reduction in drive power for the power amplifier 400 in FIG. 4 can be realized in comparison to FIG. 1, to obtain the same IF output power level. Without the power splitter, power is not cut in half before being provided to each balun. Further, inductors 420–423 separate the baluns and SRDs so that no termination is provided to the SRD impulses to reduce power, unlike with pulses provided to a balun formed with a stripline to slotline transition as shown in FIG. 3. As illustrated in FIG. 1, 4.8 Watts of DC power is required by amplifier 100 to provide a +24 dBm LO power signal to the SRD 102, but in FIG. 4, 0.6 Watts of DC power is required by amplifier 400 to provide a +12 dBm DO power signal to SRDs 414 and 416 to maintain substantially the same IF level. Note that although specific drive power levels are shown with amplifier 400, such values are only for purposes of illustration, and other values may be utilized.

Further, coupled to the terminals of each SRD 414 and 416 are series connected diodes. Series connected diodes 424 and 426 have ends coupled to the terminals of SRD 414 for providing an IF signal (IFA). The junction of diodes 424 and 426 are connected to receive an RF signal (RFA). Series connected diodes 428 and 430 have ends coupled to the terminals of SRD 416 for providing an IF signal (IFB). The junction of diodes 428 and 430 are connected to receive an RF signal (RFB).

The diodes 424, 426, 428 and 430 are driven to turn on and off by the voltage impulses from SRDs 414 and 416. To prevent the diodes 424, 426, 428 and 430 from being driven by the LO signal itself and allowing an IF signal to develop, blocking capacitors 431–434 are provided. Blocking capacitors 431 and 432 serve to couple the ends of series connected diodes 424 and 426 to the terminals of the SRD 414. Blocking capacitors 433 and 434 serve to couple the ends of series connected diodes 428 and 430 to the terminals of the SRD 416. Each of the blocking capacitors 431–434 is sized to provide a low impedance to the voltage impulses from SRDs 414 and 416, while providing a high impedance to the LO signal and the IF signals IFA and IFB.

In operation, the dual sampler circuit of FIG. 4 functions similar to a conventional dual sampler. Sampler switch 406 functions to provide the RF signal (RFA) at the IF output (IFA) when enabled by a voltage impulse from the SRD 414 as controlled by the LO signal. Similarly, sampler switch 408 functions to provide the RF signal (RFB) at the IF output (IFB) when enabled by a voltage impulse from the SRD 416 as controlled by the LO signal.

Because two SRDs are utilized, measures must be taken to assure that little phase shift occurs between the impulses provided by each SRD. The SRDs typically provide a voltage impulse at a constant LO voltage, assuming temperature remains constant. With the voltage impulse occurring at a constant LO voltage value, any difference between the voltage value which one SRD provides an impulse as opposed to the other can be calibrated out in a VECR.

Temperature variations over time between the SRDs will, however, cause phase variations which will not remain calibrated out. With the harmonic number (H) being 1, temperature variations will cause minimal variations between when the SRDs provide voltage impulses. However, with the number H increasing with RF frequency, variations between when the SRDs provide voltage impulses will have a significant effect on measurements made by a VECR. The present invention, thus, further provides temperature compensation circuits 440 and 442 connected to the respective baluns 410 and 412 in each sampler switch to provide a DC offset voltage to each SRD to compensate for temperature variations. Temperature compensation circuit 440 is connected between the balun 410 and ground at node 441 as separated by a DC voltage blocking capacitor 446. Temperature compensation circuit 442 is connected between the balun 412 and ground as separated from ground by a DC voltage blocking capacitor 448.

To determine the offset voltage necessary to compensate for temperature variations, reference is made to the equation for the resistance r of a forward biased diode:

$$r = kT/q \, I$$

where T is the diode temperature, I is the diode current and k and q are constants. For the diode voltage, the following equation can further be derived:

$$V = kT/q$$

As can be seen, with any change in the SRD temperature ΔT, a proportional change in the SRD voltage will occur as follows:

$$\Delta V = k\Delta T/q$$

Since the change in the SRD voltage is proportional to the change in temperature, ΔT, to compensate for temperature variations and assure the SRD provides an impulse at a constant LO voltage, the SRD voltage itself can be measured by the temperature compensation circuit and fed back with an appropriate gain to the diode as a DC voltage offset to provide temperature compensation.

Figure 5:
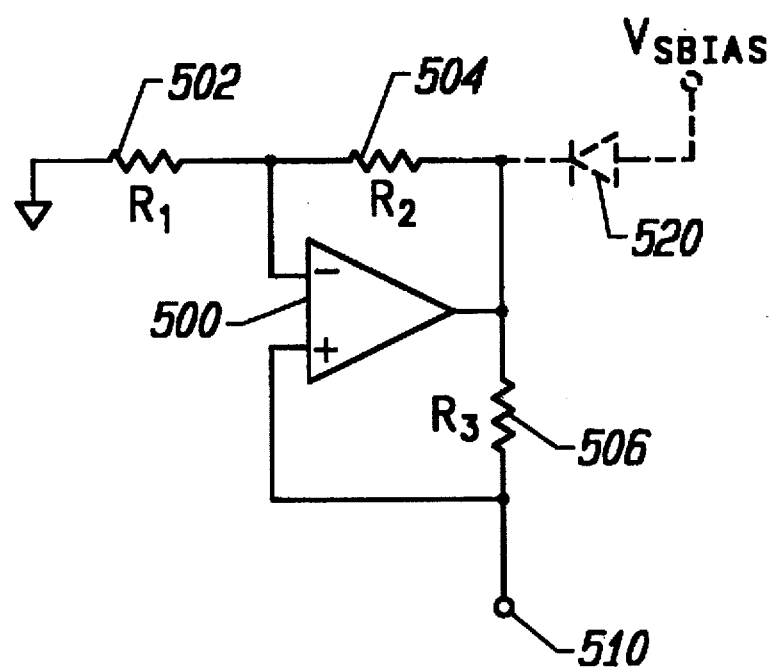
FIG. 5 shows circuitry for the temperature compensation circuits of FIG. 4.

FIG. 5 shows an embodiment of circuitry which may be used for the temperature compensation circuits 440 and 442 Of FIG. 4. The circuit of FIG. 5 used for circuits 440 and 442 will measure the diode voltage of respective SRDs 414 and 416 and automatically provide a DC voltage offset with gain to compensate for temperature variations as described. As shown, the temperature compensation circuit includes an operational amplifier 500 having a noninverting terminal for coupling to a terminal of an SRD, an inverting terminal connected by a first resistor 502 ($R_1$) to ground, and an output connected by a second resistor 504 ($R_2$) to the inverting terminal and by a third resistor 506 ($R_3$) connected to the non-inverting terminal.

In operation, the voltage at the non-inverting terminal of the operational amplifier 500 will provide a measurement of the voltage on an SRD. For instance, with the circuit of FIG. 5 utilized for temperature compensation circuit 440, node 510 will be connected to node 414 to provide the voltage of SRD 414 to the non-inverting terminal of operational amplifier 510. Assuming that V is the SRD voltage, the voltage at the output of the amplifier 510 then will be $V(1+R_2/R_1)$, or V multiplied by a specific gain value. With the sizes of resistors $R_1$–$R_3$ appropriately set, the DC offset provided by the circuit of FIG. 5 can provide precise compensation for any temperature variations.

Alternatively, the values for resistors $R_1$–$R_3$ can be chosen so that the gain provided by the circuit of FIG. 5 more than compensates for any temperature changes. Phase variations between voltage impulses provided by the SRDs caused by such excess gain can then be calibrated out. Providing such excess gain further enables resistors $R_1$–$R_3$ to be provided with imprecise resistance values, since calibration will compensate for such imprecision.

With excess gain provided by the temperature compensation circuits 440 and 442 of FIG. 4, the voltage requirements of power amplifier 400 may be reduced, while still enabling the SRDs 414 and 416 to provide the same output voltage. However, if the voltage output of the power amplifier 400 is reduced significantly, since the circuit of FIG. 5 measures the voltage on the SRD 414 to enable it to provide a DC offset, the voltage on the SRD 414 may be insufficient at start-up for the SRD to provide impulses.

To enable start-up while relying on the excess gain of the circuit of FIG. 5, a diode 520, shown in dashed lines, may be provided as connected to the output of the operational amplifier 500. The diode 520 receives a start-up bias voltage $V_{SBIAS}$ to enable the circuit of FIG. 5 to provide a significant output voltage at start-up irrespective of the voltage value on an SRD 414 as coupled to node 510.

Although the invention has been described above with particularity, this was merely to teach one of ordinary skill in the art how to make and use the invention. Many modifications will fall within the scope of the invention, as that scope is defined by the claims which follow.

What is claimed is:

1. A dual sampler circuit comprising:
    a power amplifier having an input for receiving an LO signal and an output coupled to a first node: and
    first and second sampler switches, each of the first and second sampler switches comprising:
        a step recovery diode (SRD) coupled to the first node for receiving the LO signal and for providing an impulsive signal after a number of cycles of the LO signal; and
        a first switching diode having a first end coupled to a first terminal of the step recovery diode to provide an IF output signal, and a second end connected for receiving a RF input signal, the first switching diode being forward biased when receiving the impulse from the step recovery diode.

2. The dual sampler circuit of claim 1 wherein the first and second sampler switches further comprise:
    a temperature compensation circuit coupled to the SRD for measuring a voltage on the SRD and providing an offset voltage to the SRD based on the voltage on the SRD so that as temperature changes, a voltage level of the LO signal which causes the SRD to provide the impulse remains substantially constant with temperature change.

3. The dual sampler circuit of claim 2 wherein the temperature compensation circuit comprises:
    an operational amplifier having a noninverting terminal coupled to the respective SRD, an inverting terminal connected by a first resistor to ground, and an output connected by a second resistor to the noninverting terminal and by a third resistor to the inverting terminal.

4. The dual sampler circuit of claim 3 wherein the temperature compensation circuits further comprises:
    a diode having a first terminal connected to a bias voltage, and a second terminal coupled to the output of the operational amplifier.

5. The dual sampler circuit of claim 1 further comprising:
    a transformer for coupling the output of the power amplifier to the first node and wherein the first and second sampler switches each further comprise:
        a second switching diode having a first end coupled to a first terminal of its respective SRD, and a second terminal connected to the second terminal of the first switching diode; and
        a balun having a first path coupling the first node to the first end of the first switching diode, and a second path coupling the first end of the second switching diode to ground.

6. The dual sampler circuit of claim 5 further comprising:
    an isolation capacitor providing a high impedance to the LO signal and a low impedance to the RF signal received by either of the first or second sampler switches, the isolation capacitor coupling the first node to ground.

7. The dual sampler circuit of claim 5, wherein each of the first and second sampler switches further comprise:
    a first isolation inductor for coupling the first terminal of its respective SRD to the first path of its respective balun: and
    a second isolation inductor for coupling the second terminal of its respective SRD to the second path of its respective balun,
    the first and second isolation inductors providing a low impedance to the LO signal while providing a high impedance to impulses from each of the SRDs.

8. The dual sampler circuit of claim 5, wherein each of the first and second switches further comprise:

a first LO blocking capacitor for coupling the first terminal of its respective SRD to the first terminal of its respective first switching diode; and a second LO blocking capacitor for coupling the second terminal of its respective SRD to the first terminal of its respective second switching diode, the first and second LO blocking capacitors providing a high impedance to the LO signal.

9. A dual sampler circuit comprising:

a power amplifier having an input for receiving an LO signal and an output;

a transformer for coupling the output of the power amplifier to a first node;

a pair of sampler switches, each sampler switch comprising: an SRD;

a first switching diode having a first end for providing an IF signal coupled to a first terminal of the SRD, a second switching diode having a first end coupled to a second terminal of the SRD and a second terminal connected to the second terminal of the first switching diode for receiving an RF signal; and a balun having a first path coupling the first node to the first end of the first diode, and a second path coupling the first end of the second diode to ground; and an isolation capacitor providing a high impedance to the LO signal and a low impedance to the RF signal received by either sampler switch in of the pair of sampler switches, the isolation capacitor coupling the first node to ground.

10. The dual sampler circuit of claim 9, wherein each sampler switch in the pair of sampler switches further comprises:

an operational amplifier having a noninverting terminal coupled between the second path of the balun and ground, an inverting terminal connected by a first resistor to ground, and an output connected by a second resistor to the noninverting terminal and by a third resistor to the inverting terminal; and a capacitor connected between the noninverting terminal of the operational amplifier and ground.

11. The dual sampler circuit of claim 10, wherein each sampler switch in the pair of sampler switches further comprises:

a diode having a first terminal connected to a bias voltage, and a second terminal coupled to the output of the operational amplifier.

* * * * *